United States Patent
Uno

(10) Patent No.: US 10,254,640 B2
(45) Date of Patent: Apr. 9, 2019

(54) REFLECTIVE ELEMENT FOR MASK BLANK AND PROCESS FOR PRODUCING REFLECTIVE ELEMENT FOR MASK BLANK

(71) Applicant: Asahi Glass Company, Limited, Chiyoda-ku (JP)

(72) Inventor: Toshiyuki Uno, Chiyoda-ku (JP)

(73) Assignee: AGC Inc., Chiyoda-ku (JP)

( * ) Notice: Subject to any disclaimer, the term of this patent is extended or adjusted under 35 U.S.C. 154(b) by 12 days.

(21) Appl. No.: 15/426,602

(22) Filed: Feb. 7, 2017

(65) Prior Publication Data

US 2017/0235218 A1  Aug. 17, 2017

(30) Foreign Application Priority Data

Feb. 16, 2016 (JP) .................. 2016-027433

(51) Int. Cl.
*G03F 1/24* (2012.01)
(52) U.S. Cl.
CPC .................. *G03F 1/24* (2013.01)
(58) Field of Classification Search
CPC ........................................ G03F 1/24
USPC ............................................ 430/5
See application file for complete search history.

(56) References Cited

U.S. PATENT DOCUMENTS

2014/0347721 A1* 11/2014 Bittner ............... G03F 7/70191
359/351

FOREIGN PATENT DOCUMENTS

| JP | 2014-17442 | 1/2014 |
| JP | 2015-56423 | 3/2015 |
| WO | WO 2015/098400 A1 | 7/2015 |

* cited by examiner

*Primary Examiner* — Christopher G Young
(74) *Attorney, Agent, or Firm* — Oblon, McClelland, Maier & Neustadt, L.L.P.

(57) ABSTRACT

A process for producing a reflective element for a mask blank, of which a reflective layer is hardly damaged at the time of etching treatment of an absorber layer. A process for producing a reflective element for a mask blank, which comprises (1) a step of forming a reflective layer on a first surface of a substrate, (2) a step of forming a first protective layer on the reflective layer, (3) a step of cleaning the substrate to form an exposed part of the reflective layer, which is not covered with the first protective layer, and (4) a step of forming a second protective layer on the first surface of the substrate to cover the exposed part of the reflective layer with the second protective layer.

21 Claims, 5 Drawing Sheets

REFLECTIVE ELEMENT FOR MASK BLANK AND PROCESS FOR PRODUCING REFLECTIVE ELEMENT FOR MASK BLANK

FIELD OF INVENTION

The present invention relates to a reflective element for a mask blank and a process for producing a reflective element for a mask blank.

BACKGROUND OF INVENTION

Recently, in the field of the semiconductor production, in order to make it possible to transfer a more fine pattern, EUV exposure technology has been promising in place of ArF exposure technology which uses ArF excimer laser light. The EUV exposure technology uses, as the exposure light, EUV (extreme ultra-violet) light having a shorter wavelength than the ArF excimer laser light. Here, the EUV light includes a soft X-ray and vacuum UV light, and is specifically light having a wavelength of from about 0.2 to 100 nm. At present, as the exposure light, EUV light having a wavelength of about 13.5 nm is mainly investigated.

In the EUV exposure technology, a reflective type mask is used. Such a mask is produced by forming respective layers such as a reflective layer, a protective layer and an absorber layer in this order on a substrate to constitute a mask blank and then patterning the absorber layer on the mask blank to have a predetermined pattern (Patent Document 1).

PRIOR ART DOCUMENT

Patent Document

Patent Document 1: JP-A-2014-17442

SUMMARY OF INVENTION

Technical Problem

In the mask blank to be used in the above-described EUV exposure technology, the protective layer has a role as a layer to stop etching. That is, in a case where a mask is produced from a mask blank, it is necessary to pattern an absorber layer to have a predetermined pattern by etching treatment. When the etching treatment is carried out, the protective layer has a function to prevent a reflective layer at the bottom side from being damaged.

However, in the step of forming such a protective layer on a reflective layer, the protective layer is often contaminated by foreign particles.

Such foreign particles are usually removed in a cleaning step after forming the protective layer. However, after removing the foreign particles, "voids" remain at portions in the protective layer where the foreign particles once existed. Particularly, if the size of foreign particles is relatively large, remaining voids may penetrate through the protective layer.

Further, if a mask blank having a protective layer containing such penetrating voids (hereinafter referred to as "penetrating voids") is subjected to etching treatment of an absorber layer, the protective layer loses the function to stop etching at portions of "penetrating voids", and the reflective layer may be damaged (eroded).

The present invention has been made under the circumstances, and it is an object of the present invention to provide a reflective element for a mask blank, of which a reflective layer is hardly damaged during etching treatment of an absorber layer. Further, it is an object of the present invention to provide a process for producing such a reflective element for a mask blank.

Solution to Problem

The present invention provides a process for producing a reflective element for a mask blank, which comprises
(1) a step of forming a reflective layer on a first surface of a substrate,
(2) a step of forming a first protective layer on the reflective layer,
(3) a step of cleaning the substrate to form an exposed part of the reflective layer, which is not covered with the first protective layer, and
(4) a step of forming a second protective layer on the first surface of the substrate to cover the exposed part of the reflective layer with the second protective layer.

Further, the present invention provides a reflective element for a mask blank, which comprises a substrate having a first surface, a reflective layer formed on the first surface of the substrate, and a protective layer formed on the reflective layer, wherein the protective layer has a first layer and a second layer, and the second layer covers the reflective layer at a region where the first layer does not exist.

Advantageous Effects of Invention

According to the present invention, a reflective element for a mask blank, of which a reflective layer is hardly damaged during etching treatment of an absorber layer, can be provided. Further, a process for producing such a reflective element for a mask blank can be provided.

DETAILED DESCRIPTION OF INVENTION

Now, one embodiment of the present invention will be described with reference to the drawings.

In the present specification, the term "mask blank" means a substrate having an absorber layer in a state before being patterned into the desired pattern. The term "mask blank" is different from a mask having a patterned absorber layer. Accordingly, at the stage of "mask blank", an absorber layer is disposed in the form of the entire surface film on a substrate, in a usual case.

Further, the term "reflective element for a mask blank" means an intermediate product at a mid-flow stage in the process for producing a mask blank, namely, a member having at least a reflective layer formed on a substrate. For example, "reflective element for a mask blank" includes a member having a reflective layer disposed on a substrate, a member having a reflective layer and a protective layer disposed on a substrate, etc.

Further, a reflective element having a reflective layer, a protective layer and an absorber layer (and further as a case requires, a low reflective layer) disposed on a substrate, corresponds to a complete member, namely "mask blank". Here, in the present specification, such a member may be also referred to simply as "reflective element for a mask blank" in some cases.

(Problem in Conventional Process for Producing Mask)

The conventional process for producing a mask is simply described with reference to FIG. 1 and FIG. 2 for better understanding of the features of the present invention.

Figure 1:
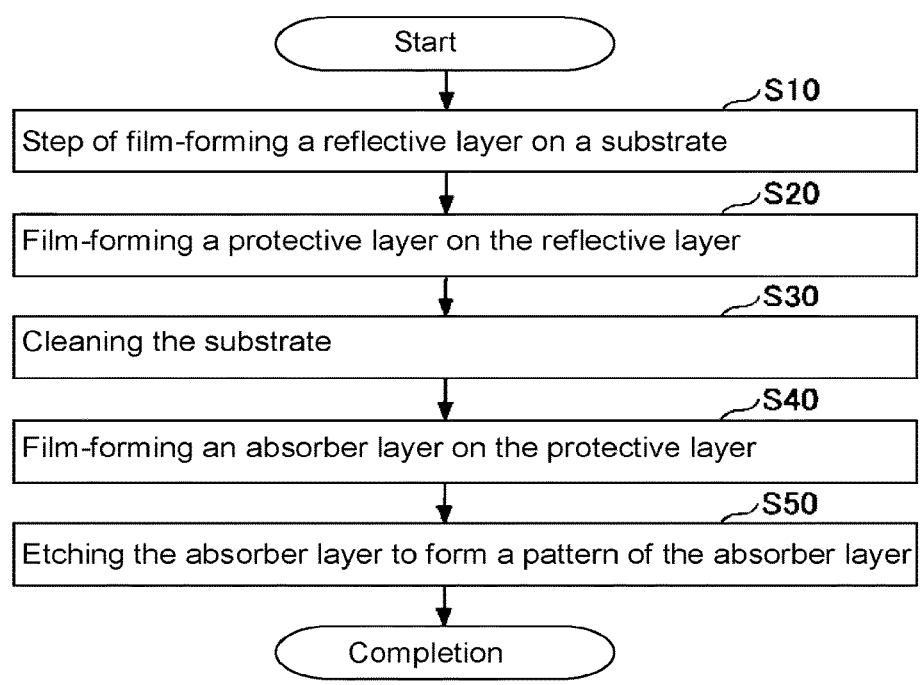
FIG. 1 is a flow diagram schematically illustrating one example of a conventional process for producing a mask.

FIG. 1 schematically illustrates one example of a flow of a conventional process for producing a mask.

As illustrated in FIG. 1, the conventional process for producing a mask (hereinafter referred to as "conventional production process") has a step (step S10) of film-forming a reflective layer on a substrate, a step (step S20) of film-forming a protective layer on the reflective layer, a step (step S30) of cleaning the substrate, a step (step S40) of film-forming an absorber layer on the protective layer and a step (step S50) of etching the absorber layer to form a pattern of the absorber layer.

Now, each step will be described with reference to FIG. 2.

First, in the step S10, a substrate 10 as illustrated in FIG. 2(a) is prepared. Further, a reflective layer 20 is film-formed on one surface of the substrate 10 as illustrated in FIG. 2(b).

Next, in the step S20, a protective layer 30 is film-formed on the reflective layer 20. The protective layer 30 has a function as an etching stop layer in a latter step S50.

Here, when the protective layer 30 is film-formed, the protective layer 30 may often be contaminated by foreign particles. Further, if the size of a foreign particle is relatively large, the protective layer 30 is divided by the foreign particle 35 as illustrated in FIG. 2(c), and is film-formed in the uncontinuous state.

Next, in the step S30, the substrate 10 is cleaned, whereby the foreign particle 35 contained in the protective layer 30 is removed.

As a result, the portion where the foreign particle 35 was present in the protective layer 30 becomes a penetrating void 37 as illustrated in FIG. 2(d). Further, an exposed part 25 which is not covered with the protective layer 30 is formed on a part of the reflective layer 20.

Then, in the step S40, an absorber layer 60 is film-formed on the protective layer 30.

The absorber layer 60 is usually formed so as to cover the protective layer 30. However, the absorber layer 60 is formed directly on the reflective layer 20 at the position of the penetrating void 37 of the protective layer 30 as illustrated in FIG. 2 (e). Accordingly, at the position of the penetrating void 37, the exposed part 25 of the reflective layer 20 is covered with the absorber layer 60.

Then, in the step S50, the absorber layer 60 is subjected to etching treatment to form a pattern of the absorber layer 60.

Here, as described above, the protective layer 30 has the etching durability against dry etching gas ions used in the etching treatment and has a function as an etching stop layer. Accordingly only the absorber layer 60 on the protective layer 30 is removed by etching.

However, the protective layer 30 does not exist at the position of the penetrating void 37. Thus, when the absorber layer 60 is etching-removed by the etching treatment, the exposed part 25 of the reflective layer 20 is exposed to dry etching gas ions at the position of the penetrating void 37. Further, the reflective layer 20 usually has no durability against dry etching gas ions used for the etching treatment. Thus, if the exposed part 25 of the reflective layer 20 is exposed to the dry etching gas ions, the reflective layer 20 is damaged (eroded).

As a result, as illustrated in FIG. 2(f), directly beneath the penetrating void 37 where the protective layer 30 does not exist, namely, at the exposed part 25 of the reflective layer 20, the reflective layer 20 is attacked by the dry etching gas ions, and thereby a damaged part 28 (for example, reduced part) is formed.

Such a damaged part 28 of the reflective layer 20 causes phase defect. Further, if a mask has such a damaged part 28 of the reflective layer 20, a problem results such that the quality of the mask deteriorates.

(Mask Blank in One Embodiment of the Present Invention)

Now, one embodiment of the present invention will be described with reference to FIG. 3.

Figure 3:
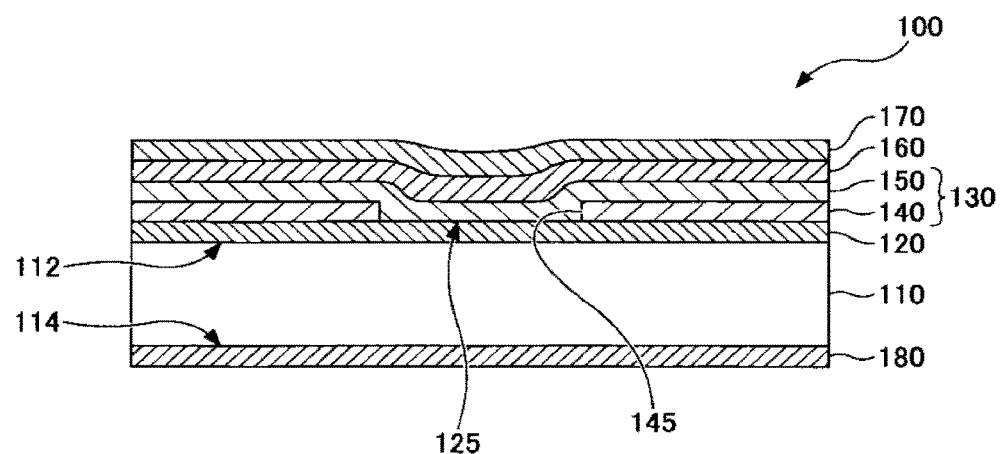
FIG. 3 is a cross-sectional view schematically illustrating one example of the structure of a mask blank in one embodiment of the present invention.

FIG. 3 schematically illustrates one example of the structure of the mask blank in one embodiment of the present invention.

As illustrated in FIG. 3, the mask blank (hereinafter referred to as "first mask blank") 100 in one embodiment of the present invention has a substrate 110 and respective layers formed on both surfaces of the substrate 110.

The substrate 110 has a first surface 112 and a second surface 114. For example, the substrate 110 may be a glass substrate.

A reflective layer 120 is disposed on the first surface 112 of the substrate 110. The reflective layer 120 has a structure so as to have a high reflectance to EUV light (wavelength of from 12 nm to 14 nm). The reflective layer 120 may, for example, be a multilayer film repeating Mo and Si.

A protective layer 130 is disposed on the reflective layer 120. The protective layer 130 has a function as an etching stop layer at the time of the etching treatment on an absorber layer 160 and a low reflective layer 170 which are formed on the protective layer 130. The protective layer 130 may, for example, comprise ruthenium (Ru) or a Ru compound.

An absorber layer 160 is disposed on the protective layer 130. The absorber layer 160 is made of a material having a high absorption to EUV light, namely a material having a low reflectivity. For example, the absorber layer 160 may comprise tantalum (Ta).

A low reflective layer 170 is disposed on the absorber layer 160. The low reflective layer 170 has a lower reflectivity to inspection light for inspecting the absorber layer 160 than the absorber layer 160. As the inspection light, for example, light having a wavelength of about 257 nm or about 193 nm may be used.

The low reflective layer 170 may, for example, be made of a material containing tantalum (Ta).

Further, the low reflective layer 170 is not an essential layer and may be omitted.

On the other hand, a conductive layer 180 is disposed on the second surface 114 of the substrate 110. For example, the conductive layer 180 is disposed so that the first mask blank 100 would be easily handled by the electrostatic chuck method or the like. The conductive layer 180 may, for example, be made of a metal such as chromium (Cr).

However, forming the conductive layer 180 is optional, and the conductive layer 180 may be omitted.

Here, in the first mask blank 100, the protective layer 130 has at least two layers of a first protective layer 140 and a second protective layer 150.

The first protective layer 140 is disposed on the upper part of the reflective layer 120. However, the first protective layer 140 has "penetrating void" 145, and the first protective layer 140 does not exist there. That is, the first protective layer 140 is disposed in the uncontinuous state due to the penetrating voids 145.

Further, in an example illustrated in FIG. 3, there is only one penetrating void 145 in the first protective layer 140. However, FIG. 3 is only one example, and there may be plural penetrating voids 145 in the first protective layer 140. Further, although it is not known from FIG. 3, the penetrating void 145 exists in the form of dot in the first protective layer 140.

Figure 2:
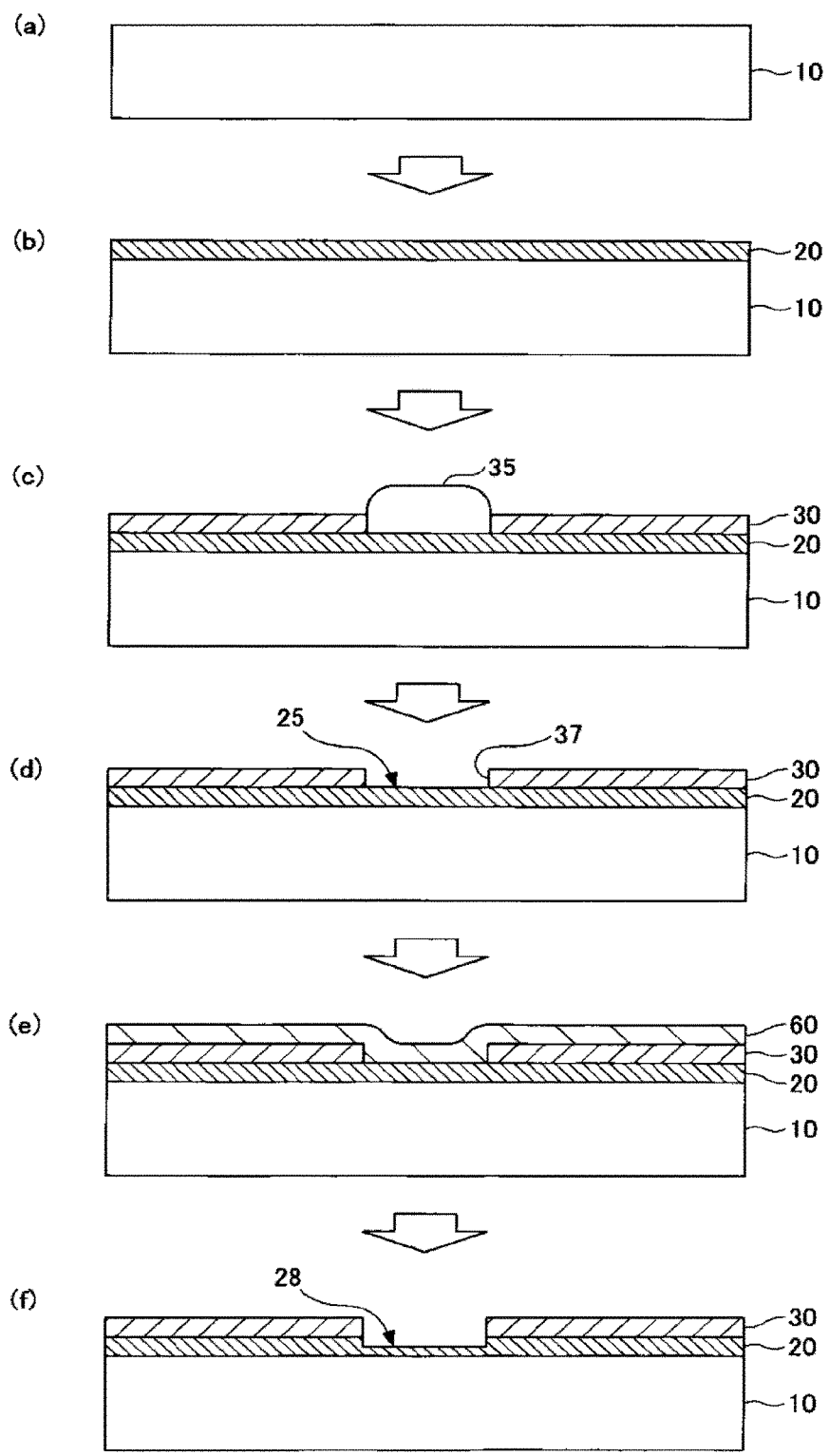
FIG. 2 is a view schematically illustrating respective steps in the conventional process for producing a mask shown in FIG. 1.

For example, as illustrated in FIG. 2, a foreign particle contained in the step of forming the first protective layer 140 is removed in a subsequent cleaning step, and thereby such a penetrating void 145 is formed. As illustrated in FIG. 2(d), in the conventional production process, an exposed part 25 which is not covered with the protective layer 30 is formed on the reflective layer 20 due to such a penetrating void 37.

On the other hand, in the first mask blank 100, the second protective layer 150 is disposed on a part of the reflective layer 120 which is not covered with the first protective layer 140, namely, on the exposed part 125. That is, any parts of the surface of the reflective layer 120 including the exposed part 125 are covered with the first protective layer 140 having function as the etching stop layer or the second protective layer 150.

Accordingly, in the first mask blank 100, the problem can be avoided such that when the absorber layer 160 and the low reflective layer 170 are subjected to be etching treatment for patterning, the above-described problem, that is, the reflective layer 120 is attacked by dry etching gas ions at the exposed part 125, and thereby the reflective layer 120 is damaged (eroded).

As a result, in a case where a mask is produced from the first mask blank 100, the phase defect generation hardly occurs on the reflective layer 120, whereby the quality of the mask can be improved.

As described above, using the first mask blank 100 illustrated in FIG. 3 as an example, the features and the effects in one embodiment of the present invention have been described. However, the embodiment of the present invention is by no means restricted to the above-described mask blank.

For example, in the structure illustrated in FIG. 3, one embodiment of the present invention may be the form of the reflective element for a mask blank, which has neither absorber layer 160 nor low reflective layer 170. Otherwise, in the structure illustrated in FIG. 3, one embodiment of the present invention may be the form of a mask having a patterned absorber layer 160 and a patterned low reflective layer 170.

(Members Constituting the First Mask Blank 100)

Here, the members constituting the first mask blank 100 will be described in detail.

(Substrate 110)

The substrate 110 is used for supporting each layer.

The material of the substrate 110 is not particularly restricted, so far as the substrate 110 may be used as the substrate for an EUV mask blank. For example, the substrate 110 may be a glass substrate.

(Reflective Layer 120)

The reflective layer 120 preferably has a high reflectivity to EUV light. For example, when EUV light is applied to the surface of the reflective layer 120 at an incident angle of 6°, the maximum value of the reflectivity in the wavelength of from 13.3 nm to 13.7 nm is preferably at least 60%.

Such a reflective layer 120 may have a multilayer film structure in which a high refractive index layer and a low refractive index layer are alternatively laminated plural times. In such a case, for example, Si is used in the high refractive index layer, and Mo may be used in the low refractive index layer. That is, a Mo/Si multilayer film may be used.

However, the reflective layer 120 is by no means restricted thereto. For example, a Ru/Si multilayer film, a Mo/Be multilayer film, a Mo compound/Si compound multilayer film, a Si/Mo/Ru multilayer film, a Si/Mo/Ru/Mo multilayer film or a Si/Ru/Mo/Ru multilayer film may be used.

In a case where the reflective layer 120 has the multilayer film structure, the film thickness of each layer and the number of repeating units in layers may be optionally selected depending on film materials to be used and the required reflectivity in the reflective layer 120. In the case of the Mo/Si film, in order to form the reflective layer 120 having the maximum value of the reflectivity of at least 60% in the wavelength of from 13.3 nm to 13.7 nm, the multilayer film is formed by laminating Mo layers having a film thickness of 2.3±0.1 nm and Si layers having a film thickness of 4.5±0.1 nm so that the number of repeating units would be from 30 to 60.

A layer (for example Si layer) resistant to oxidation is preferably used as the uppermost layer in the reflective layer 120 in order to prevent the surface oxidation of the reflective layer 120.

The total thickness of the reflective layer 120 may, for example, be in a range of from 210 nm to 420 nm.

(Protective Layer 130, Namely First Protective Layer 140 and Second Protective Layer 150)

The first protective layer 140 and the second protective layer 150 are formed as etching stopping layers at the time of subjecting the absorber layer 160 and the low reflective layer 170 to patterning treatment as described above.

The etching technique used for the patterning treatment on the absorber layer 160 and the low reflective layer 170 is usually a dry etching process, and as dry etching gas ion, namely etching gas, a chlorine type gas, a fluorine type gas or the like is often used.

Accordingly, the first protective layer 140 and the second protective layer 150 are made of a material having resistance to such gas. In general, the etching rate of the first protective layer 140 and the second protective layer 150 is preferably at most 1/10 of the etching rate of the absorber layer 160.

Further, the first protective layer 140 and the second protective layer 150 are required to have sufficient reflectivity so that the reflectivity to EUV light would not be impaired due to themselves.

As such a material, ruthenium (Ru) or a ruthenium (Ru) compound may be mentioned. Particularly, as the Ru compound layer, RuB, RuNb or RuZr may be mentioned.

In a case where the first protective layer 140 or the second protective layer 150 is made of a Ru compound, the content of Ru is preferably at least 50 at %, more preferably at least 80 at %, particularly preferably at least 90 at %.

The first protective layer 140 and the second protective layer 150 may be made of the same material. Otherwise, the second protective layer 150 may be made of a different material from the first protective layer 140.

In a case where they are made of different materials, the second protective layer 150 preferably has a higher resistance to dry etching gas ions than the first protective layer 140, because the second protective layer 150 is generally thinner than the first protective layer 140.

For example, the etching rate of the second protective layer 150 is at most ½, preferably at most ⅓ of the etching rate of the first protective layer 140.

For example, the first protective layer 140 is made of a Ru compound, and the second protective layer 150 may be made of a Ru metal.

For example, the thickness of the first protective layer 140 is in a range of from 1 nm to 4 nm.

On the other hand, for example, the thickness of the second protective layer 150 is preferably in a range of from 0.3 nm to 3.0 nm. The thickness of the second protective layer 150 is particularly preferably in a range of from 0.3 nm to 0.6 nm.

If the second protective layer 150 exceeds 0.6 nm, the reflectivity of the first mask blank 100 to EUV light may deteriorate. On the other hand, if the second protective layer 150 is less than 0.3 nm, the function as the etching stop layer may be insufficient.

(Absorber Layer 160)

The absorber layer 160 preferably has a high absorption to EUV light, namely a low reflectivity to EUV light. For example, when EUV light is applied on the surface of the absorber layer 160, the average reflectivity at the wavelength of from 13.3 nm to 13.7 nm is preferably at most 4.0%.

In order to obtain such a feature, the absorber layer 160 is, for example, made of a material containing at least 40 at % of Ta, preferably at least 50 at %, more preferably at least 55 at %.

The material containing Ta as the main component to be used for the absorber layer 160 preferably contains at least one element of Hf, Si, Zr, Ge, B, Pd, Pt, H and N, in addition to Ta.

As specific examples of the material containing the above element in addition to Ta, for example TaN, TaNH, TaHf, TaHfN, TaBSi, TaBSiN, TaB, TaBN, TaSi, TaSiN, TaGe, TaGeN, TaZr, TaZrN, TaPd, TaPdN, TaPt and TaPtN may be mentioned. Here, the absorber layer 160 preferably contains no oxygen.

Specifically, the content of oxygen in the absorber layer 160 is preferably less than 25 at %.

For example, the absorber layer 160 has a thickness in a range of from 30 nm to 100 nm.

(Low Reflective Layer 170)

The low reflective layer 170 has a lower reflectivity to inspection light for inspecting a pattern of the absorber layer 160 than the absorber layer 160. As the inspection light, for example, light having a wavelength of about 257 nm or about 193 nm may be used.

The low reflective layer 170 may, for example, be made of a material containing Ta. Further, the low reflective layer 170 may contain at least one element of Hf, Ge, Si, B, N, H and O, in addition to Ta.

The low reflective layer 170 may, for example, be made of TaO, TaON, TaONH, TaBO, TaHfO, TaHfON, TaBSiO, TaBSiON, SiN or SiON.

The total thickness of the absorber layer 160 and the low reflective layer 170 is, for example, in a range of from 10 nm to 65 nm. The total thickness is preferably in a range of from 30 to 100 nm, more preferably in a range of from 35 nm to 85 nm.

If the low reflective layer 170 is thicker than the absorber layer 160, the EUV light absorption characteristic of the absorber layer 160 may be impaired. Thus, the thickness of the low reflective layer 170 is preferably thinner than that of the absorber layer 160.

For example, the thickness of the low reflective layer 170 is from 1 nm to 20 nm, preferably from 1 nm to 10 nm, more preferably from 1 nm to 8 nm.

Further, as described above, the low reflective layer 170 is a layer formed as a case requires and is not always necessary.

(Conductive Layer 180)

As described above, the conductive layer 180 is a layer formed as a case requires.

However, the conductive layer 180 is useful at the time of holding the first mask blank 100 by the electrostatic chick method. For example, the second surface 114 of the substrate 110 has the conductive layer 180, the substrate 110 is held with electrostatic chuck, and under such a state, each handling such as film formation treatment can be carried out on the first surface 112 of the substrate 110, etc.

The conductive layer 180 may, for example, be made of Si, TiN, Mo, Cr, CrN, CrO or TaSi. The conductive layer 180 may have a sheet resistance of at most 100Ω per square, and the thickness of the conductive layer 180 is for example, from 10 nm to 1,000 nm.

(Process for Producing the Mask of the Present Invention in One Embodiment)

Figure 4:
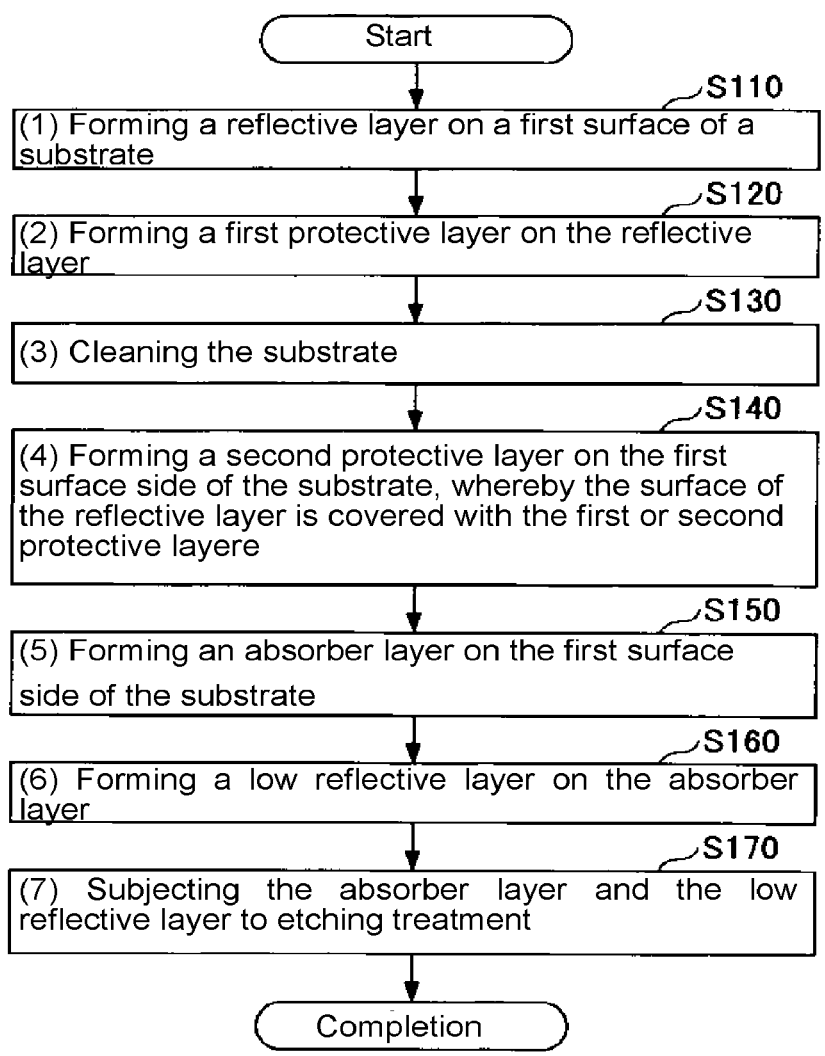
FIG. 4 is a flow diagram schematically illustrating one example of a process for producing a mask blank in one embodiment of the present invention.
Figure 5:
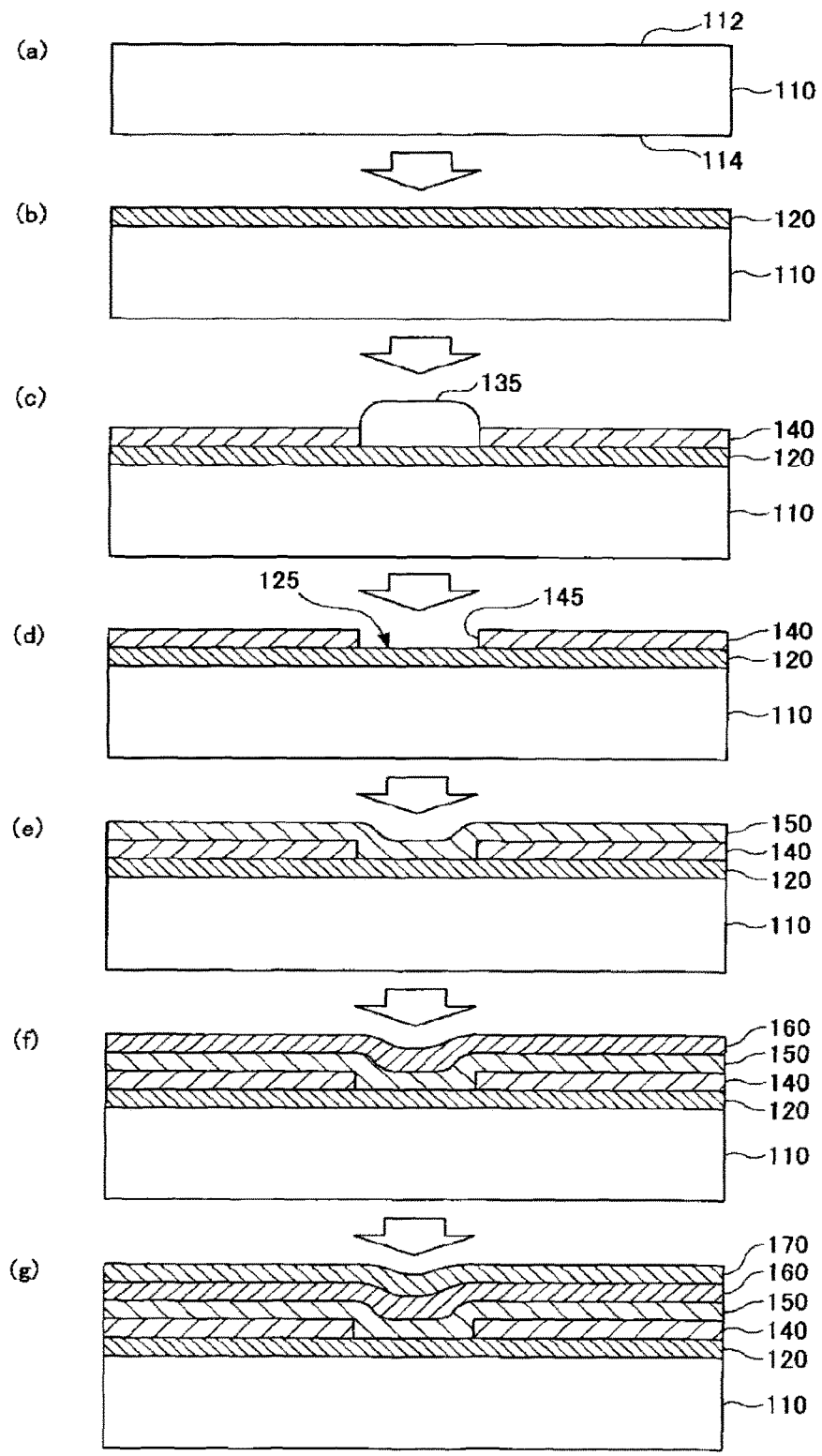
FIG. 5 is a view schematically illustrating modes of respective steps in the process for producing a mask blank illustrated in FIG. 4.

Next, the process for producing a mask of the present invention in one embodiment will be described with reference to FIG. 4 and FIG. 5. FIG. 4 shows a flow diagram schematically illustrating one example of one embodiment of the process for producing a mask blank of the present invention. Further, FIG. 5 schematically illustrating modes of respective steps illustrated in FIG. 4.

As illustrated in FIG. 4, the process for producing a reflective element for a mask blank in one embodiment of the present invention (hereinafter referred to also as "first production process") comprises (1) a step of forming a reflective layer on a first surface of a substrate (step S110), (2) a step of forming a first protective layer on the reflective layer (step S120), (3) a step of cleaning the substrate (step S130), (4) a step of forming a second protective layer on the first surface of the substrate to cover the surface of the reflective layer with the first or the second protective layer (step S140), (5) a step of forming an absorber layer on the first surface side of the substrate (step S150), (6) a step of forming a low reflective layer on the absorber layer (step S160) and (7) a step of subjecting the absorber layer and the low reflective layer to etching treatment (step S170).

Now, each step will be described with reference to FIG. 5. Here, reference symbols mentioned in FIG. 3 are used for clearly representing each member.

(Step S110)

First, a substrate 110 is prepared.

In FIG. 5(a), a cross-sectional view of the substrate 110 is schematically illustrated. The substrate 110 has a first surface 112 and a second surface 114 which face each other.

As described above, the material of the substrate 110 is not particularly restricted, and the substrate 110 may be made of glass, silicon, a metal or the like, Next, as illustrated in FIG. 5(b), a reflective layer 120 is formed on the first surface 112 of the substrate 110.

As described above, the reflective layer 120 may be an alternative lamination film of Mo films and Si films.

The method for forming the reflective layer 120 is not particularly restricted. The reflective layer 120 may be formed by means of a film-formation method such as the magnetron sputtering method or the ion beam sputtering method.

For example, in a case where a Mo/Si multilayer film is formed by means of the ion beam sputtering method, a step of forming a Mo layer by using a Mo target and a step of forming a Si layer by using a Si target may be alternatively repeated.

(Step S120)

Next, a first protective layer 140 is formed on the reflective layer 120.

As described above, the first protective layer 140 is made of a material having resistance to dry etching gas ions to be used in step S170. The first protective layer 140 may, for example, be made of ruthenium (Ru) or a Ru compound.

The method for forming the first protective layer is not particularly restricted. The first protective layer 140 may, for example, be formed by a film formation method such as the magnetron sputtering method or the ion beam sputtering method.

As described above, in the step of forming the first protective layer 140, the first protective layer 140 is often contaminated by foreign particles. Further, if the foreign particles have a relatively large size, the first protective layer 140 is divided by the foreign particle 135 as illustrated in FIG. 5(c), and thereby a film is formed in the uncontinuous form.

(Step S130)

Next, the substrate 110 is cleaned, whereby the foreign particle 135 is removed.

The cleaning process is not particularly restricted. The cleaning process may, for example, be carried out by wet washing the substrate 110 with pure water or the like. Otherwise, the cleaning process may be dry cleaning such as solid $CO_2$ jet.

As illustrated in FIG. 5(d), after the cleaning process, the part of the first protective layer 140 where the foreign particle 130 is contained becomes a penetrating void 145. The first protective layer 140 does not exist at the part of the penetrating void 145. Thus, an exposed part 125 not covered with the first protective layer 140 is partially generated on the surface of the reflective layer 120.

Further, after the cleaning process, an oxide layer is formed on a part of the surface of the first protective layer 140 by the cleaning process.

(Step S140)

Next, the second protective layer 150 is formed so as to cover the first protective layer 140.

Here, as illustrated in FIG. 5(e), the second protective layer 150 is formed so as to cover the exposed part 125 of the reflective layer 120 in addition to the first protective layer 140.

Further, in an example illustrated in FIG. 5(e), the second protective layer 150 is formed on the first surface 112 of the substrate 110 entirely. However, FIG. 5(e) is only one example, and it is sufficient if the second protective layer 150 is formed so as to cover at least the exposed part 125 of the reflective layer 120.

Here, in a case where the second protective layer 150 is formed by a film formation process such as the sputtering method, the second protective layer 150 is preferably formed on the first surface 112 entirely as illustrated in FIG. 5(e). In such a case, it is not necessary to carry out treatment such as masking, and thereby the second protective layer 150 can be easily formed.

As described above, the second protective layer 150 is made of a material having resistance to dry etching gas ion to be used in step S170. The second protective layer 150 may, for example, be made of ruthenium (Ru) or a Ru compound.

The method for forming the second protective layer 150 is not particularly restricted. The second protective layer 150 may be formed by means of a film-formation method such as the magnetron sputtering method or the ion beam sputtering method.

(Step S150)

Next, as illustrated in FIG. 5(f), an absorber layer 160 is formed so as to cover the second protective layer 150.

As described above, the absorber layer 160 is made of a material having a high absorption to EUV light, namely having a low reflectance to EUV light. For example, the absorber layer 160 is made of a material containing at least 40 at % of Ta, preferably at least 50 at %, more preferably at least 55 at %.

The method for forming the absorber layer 160 is not particularly restricted. The absorber layer 160 may be formed by means of a film formation method such as the magnetron sputtering method or the ion beam sputtering method.

(Step S160)

Next, as illustrated in FIG. 5(g), a low reflective layer 170 is formed on the absorber layer 160.

The method for forming the low reflective layer 170 is not particularly restricted. The low reflective layer 170 may, for example, be made of a material containing Ta.

The low reflective layer 170 may, for example, be formed by a film formation method such as the magnetron sputtering method or the ion beam sputtering method.

Further, the step S160 is not an essential step and may be omitted.

For example, a mask blank having the structure as illustrated in FIG. 5(g) can be produced by the above steps.

(Step S170)

Next, the absorber layer 160 (if exist, the low reflective layer 170. The same applies hereinafter) is subjected to etching treatment. Thus, a mask having the desired pattern of the absorber layer 160 is produced.

Here, in the first production process, as described above, the second protective layer 150 is formed in step S140. The second protective layer 150 is disposed so as to cover the exposed part 125 of the reflective layer 120 which is not covered with the first protective layer 140. As a result, all parts containing the exposed part 125 on the surface of the reflective layer 120 are covered with the first protective layer 140 or the second protective layer 150 which have the function as the etching stop layer.

Accordingly, in the first production process, the above-described problem can be avoided, namely the problem such that the exposed part 125 on the reflective layer 120 is attacked by dry etching gas ions, and thereby the reflective layer 120 is damaged (eroded) at the time of etching treatment on the absorber layer 160 in step S170 can be avoided.

As a result, in the first production process, a high quality mask in which the phase defect generation which may occur on the reflective layer 120 can be effectively suppressed, can be provided.

As described above, with reference to the example of the first production process illustrated in FIG. 4, the features and the effects in one mode of the present invention have been described. However, the mode of the present invention is by no means restricted to the first production process.

For example, in another mode of the present invention, step S170 in the first production process may be omitted. In such a case, a high quality mask blank in which the phase defect generation is effectively suppressed can be produced. Further, the steps after S160 may be omitted in the first production process. In such a case, a mask blank having no low reflective layer can be produced. Further, the steps after step S150 in the first production process may be omitted. In such a case, a reflective element for a mask blank can be produced.

Further, in these modes, a step of forming a conductive layer 180 on the second surface 114 of the substrate 110 may be added.

Further, another mode may be assumed for those skilled in the art.

EXAMPLES

Now, the examples of the present invention will be described. Further, in the following description, Ex. 1 to Ex. 8 are Practical Examples, and Ex. 9 and Ex. 10 are Comparative Examples.

Ex. 1

A mask blank is produced by the following method.

First, as the substrate, a glass substrate ($SiO_2$—$TiO_2$ type) having length of 152.4 mm×width of 152.4 mm×thickness of 6.3 mm is prepared.

Next, a conductive layer is formed on one surface (second surface) of the glass substrate. As the conductive layer, a Cr layer is film-formed so as to have a thickness of about 100 nm by the magnetron sputtering method. The sheet resistance of the conductive layer is 100Ω per square.

Next, a reflective layer is film-formed on the first surface of the glass substrate.

The ion bean sputtering method is employed for the film formation. A Mo layer having a thickness of 2.3 nm and a Si layer having a thickness of 4.5 nm are alternatively film-formed 40 times to form a Mo/Si multilayer film.

A Mo target is used for the film formation of the Mo layer, and the ion beam sputtering is carried out under Ar gas atmosphere (gas pressure: 0.02 Pa). The deposition rate is 3.84 nm/min.

On the other hand, a Si target doped with boron is used for the film formation of the Si layer, and the ion beam sputtering is carried out under Ar gas atmosphere (gas pressure: 0.02 Pa). The deposition rate is 4.62 nm/min.

The total thickness (desired value) of the reflective layer is (2.3 nm+4.5 nm)×50 times=340 nm.

Next, a first protective layer is film-formed on the reflective layer by the ion beam sputtering method.

The first protective layer is a Ru layer. The ion beam sputtering is carried out to form a Ru layer as the first protective layer by using a Ru target under Ar gas atmosphere (gas pressure: 0.02 Pa). The deposition rate is 3.12 nm/min. The film thickness of the first protective layer is 2.5 nm.

Further, at the time of the film formation of the first protective layer, the cleaning degree under the atmosphere is intentionally lowered, and the film formation is carried out under a condition that the first protective layer is easily contaminated by foreign particles.

Next, the glass substrate on which each film is formed is cleaned with deionized water.

The first surface side of the cleaned glass substrate is scanned by an atomic force microscope (AFM) apparatus (model SFA460: manufactured by SII Nano Technology Inc.). As a result, it is observed that the first protective layer has at least one penetrating void.

Next, a second protective layer (Ru layer) is film-formed on the first protective layer. The second protective layer is film-formed under the same condition as the first protective layer. However, the thickness of the second protective layer is 0.6 nm.

Next, an absorber layer is formed on the second protective layer by the magnetron sputtering method.

The magnetron sputtering is carried out to form a TaN layer as the absorber layer by using a Ta target under a mixed gas containing Kr and $N_2$ (Kr=91 vol %, $N_2$=9 vol %) atmosphere (gas pressure: 0.18 Pa). The deposition rate is 7.7 nm/min, and the film thickness is 77 nm.

Next, a low reflective layer is formed on the absorber layer by the magnetron sputtering method.

The magnetron sputtering is carried out to form a TaON layer as the low reflective layer by using a Ta target under a mixed gas containing Ar, $O_2$ and $N_2$ (Ar=60 vol %, $O_2$=30 vol %, $N_2$=10 vol %) atmosphere (gas pressure: 0.29 Pa). The deposition rate is 1.32 nm/min. The film thickness of the low reflective layer is 7 nm.

Thus, a mask blank of Ex. 1 (sample 1) is produced.

Ex. 2 to Ex. 8 and Ex. 13 to Ex. 20

Mask blanks of Ex. 2 to Ex. 8 and Ex. 13 to Ex. 20 are produced in the same manner as in Ex. 1.

However, in the above Ex., the thickness of the first protective layer, the second protective layer, the absorber layer and/or the low reflective layer is different from Ex. 1.

Hereinafter, the mask blanks obtained in Ex. 2 to Ex. 8 and Ex. 13 to Ex. 20 are referred to as sample 2 to sample 8 and sample 13 to sample 20 respectively.

Ex. 9

A mask blank (referred to as sample 9) of Ex. 9 is produced by the same method as in Ex. 1. However, in Ex. 9, the second protective layer is not film-formed on the first protective layer. That is, after forming the first protective layer, the absorber layer is film-formed. The other production conditions are the same as in Ex. 1.

Ex. 10 to Ex. 12

Mask blanks (referred to as sample 10 to sample 12 respectively) of Ex. 10 to Ex. 12 are produced by the same method as in Ex. 9. However, the film thickness of the absorber layer and the low reflective layer in Ex. 10 to Ex. 12 is different from Ex. 9. The other production conditions are the same as Ex. 9.

The film thickness of each layer in sample 1 to sample 20 is shown together in the following Table 1.

TABLE 1

| Sample | Film thickness of first protective layer (nm) | Film thickness of second protective layer (nm) | Film thickness of absorber layer (nm) | Film thickness of low reflective layer (nm) | Presence or absence of exposed part of reflective layer |
|---|---|---|---|---|---|
| 1 | 2.5 | 0.6 | 77 | 7 | Absent |
| 2 | 2.5 | 0.5 | 77 | 7 | Absent |
| 3 | 2.5 | 0.4 | 77 | 7 | Absent |

TABLE 1-continued

| Sample | Film thickness of first protective layer (nm) | Film thickness of second protective layer (nm) | Film thickness of absorber layer (nm) | Film thickness of low reflective layer (nm) | Presence or absence of exposed part of reflective layer |
|---|---|---|---|---|---|
| 4 | 2.5 | 0.3 | 77 | 7 | Absent |
| 5 | 2.5 | 0.6 | 58 | 2 | Absent |
| 6 | 2.5 | 0.5 | 58 | 2 | Absent |
| 7 | 2.5 | 0.4 | 58 | 2 | Absent |
| 8 | 2.5 | 0.3 | 58 | 2 | Absent |
| 9 | 2.5 | — | 77 | 7 | Present |
| 10 | 2.5 | — | 58 | 2 | Present |
| 11 | 2.5 | 0.2 | 77 | 7 | Present |
| 12 | 2.5 | 0.2 | 58 | 2 | Present |
| 13 | 2.5 | 3.0 | 77 | 7 | Absent |
| 14 | 2.5 | 1.0 | 77 | 7 | Absent |
| 15 | 1.0 | 3.0 | 77 | 7 | Absent |
| 16 | 1.0 | 0.3 | 77 | 7 | Absent |
| 17 | 2.5 | 3.0 | 58 | 2 | Absent |
| 18 | 2.5 | 1.0 | 58 | 2 | Absent |
| 19 | 1.0 | 3.0 | 58 | 2 | Absent |
| 20 | 1.0 | 0.3 | 58 | 2 | Absent |

(Etching Treatment)

The dry etching treatment is carried out on the low reflective layer and the absorber layer of each sample.

Plasma RF etching treatment is employed as the dry etching treatment. Here, a mask is not used at the time of the etching treatment, and the entire surface is etched.

First, the low reflective layer is removed by first etching treatment with fluorine type gas. As the fluorine type gas, $CF_4$/He (gas flow rate: 4 sccm/16 sccm) mixed gas is used, and the gas pressure is 0.3 Pa. Further, bias RF is 50 W, and the trigger pressure is 3 Pa. The distance between electrode and substrates is 55 mm.

Next, the absorber layer is removed by second etching treatment with chlorine type gas. As the chlorine type gas, $Cl_2$/He (gas flow rate: 4 sccm/16 sccm) mixed gas is used, and the gas pressure is 0.3 Pa. Further, the bias Rf is 50 W, and the trigger pressure is 3 Pa. The distance between electrode and substrates is 55 mm.

Further, during etching the absorber layer, the presence or absence of the Ru component in the atmosphere is monitored to measure time (referred to as "time for removing the absorber layer") until detecting the Ru component. Here, the point of time at which the Ru component is detected is referred to as "absorber layer removing point".

The "absorber layer removing point" can be considered as the point of time at which the absorber layer is removed by the etching. However, the possibility that the absorber layer locally remains at the absorber layer removing point cannot be denied. Thus, over etching treatment for 30% time of the time for removing the absorber layer is carried out from the absorber layer removing point.

The low reflective layer and the absorber layer are removed from the surface of each sample by the above-described etching treatment.

(Evaluation)

The surface (corresponding to the first surface side of the glass substrate) of each sample is observed by using the above AFM apparatus after the etching treatment. In such a case, in sample 1 to sample 8, the surface to be observed corresponds to the surface of the second protective layer, and in sample 9 and sample 10, the surface to be observed corresponds to the surface of the first protective layer.

The presence or absence of the exposed part of the reflective layer is evaluated through the second protective layer and/or the first protective layer by such an observation.

The obtained evaluation results of each sample is mentioned together in the column of "presence or absence of exposed part of reflective layer" in the above-described Table 1.

It is evident from the results that a part of the reflective layer in sample 9 to sample 12 is not covered with the first protective layer, and the surface of the reflective layer is exposed. The possibility that the reflective layer is damaged at the time of etching treatment, is high at such an exposed part.

On the other hand, it is evident that the surface of the reflective layer in sample 1 to sample 8 and sample 13 to sample 20 is not exposed. Accordingly, the possibility that the reflective layer is damaged at the time of etching treatment, is low in sample 1 to sample 8 and sample 13 to sample 20.

Further, as described above, it is observed that sample 1 to sample 8 and sample 13 to sample 20 have a penetrating void (the exposed part of the reflective layer) before film-forming the second protective layer. Accordingly, it is assumed that the exposed part of the reflective layer is covered by forming the second protective layer in sample 1 to sample 8 and sample 13 to sample 20. Further, it is considered from the above that in sample 1 to sample 8 and sample 13 to sample 20, at the time of the etching treatment, the second protective layer has a function as the etching stop layer for the reflective layer.

As described above, by forming the second protective layer after forming the first protective layer, the exposed part of the reflective layer is covered, and it is assumed that the reflective layer is suppressed from being damaged at the time of the etching.

REFERENCE SYMBOLS

10: substrate, 20: reflective layer, 25: exposed part, 28: damaged part, 30: protective layer, 35: foreign particle, 37: penetrating void, 60: absorber layer, 100: first mask blank, 110: substrate, 112: first surface, 114: second surface, 120: reflective layer, 125: exposed part, 130: protective layer, 140: first protective layer, 145: penetrating void, 150: second protective layer, 160: absorber layer, 170: low reflective layer, 180: conductive layer The entire disclosure of Japanese Patent Application No. 2016-027433 filed on Feb. 16, 2016 including specification, claims, drawings and summary is incorporated herein by reference in its entirety.

What is claimed is:

1. A process for producing a reflective element suitable for a mask blank, the process comprising:
   (1) forming a reflective layer on a first surface of a substrate,
   (2) forming a first protective layer on the reflective layer,
   (3) cleaning the substrate to form an exposed part of the reflective layer, wherein the exposed part is not covered with the first protective layer, and
   (4) forming a second protective layer on a first surface side of the substrate to cover the exposed part with the second protective layer.

2. The process of claim 1, wherein the second protective layer has a thickness in a range of 0.3 to 3.0 nm.

3. The process of claim 1, wherein the second protective layer has a thickness in a range of 0.3 to 0.6 nm.

4. The process of claim 1, wherein the first protective layer comprises ruthenium (Ru) or a ruthenium compound.

5. The process of claim 1, wherein the process further comprises:

(5) forming an absorber layer on the first surface side of the substrate after (4), and (6) optionally forming a low reflective layer on the absorber layer.

6. The process of claim 5, wherein the process further comprises (6) forming a low reflective layer on the absorber layer.

7. The process of claim 6, wherein the low reflective layer and the absorber layer comprise tantalum (Ta).

8. The process of claim 5, wherein the process further comprises (7) etching the absorber layer and, if the low reflective layer is present, the low reflective layer.

9. The process of claim 1, wherein the first protective layer and the second protective layer are made of the same material.

10. The process of claim 1, wherein the second protective layer is made of a different material than the first protective layer.

11. The process of claim 8, wherein (7) comprises etching with dry etching gas ions, and the second protective layer is made of a material that has an etching durability higher than an etching durability of the first protective layer, wherein the etching durability of the material and the etching durability of the first protective layer are with respect to the dry etching gas ions.

12. The process of claim 1, wherein the reflective layer has a repeating structure of a Mo film and a Si film.

13. A reflective element, comprising:

a substrate having a first surface, a reflective layer formed on the first surface, and a protective layer formed on the reflective layer, wherein the protective layer has a first layer and a second layer, and the second layer covers an exposed part of the reflective layer where the first layer does not exist.

14. The reflective element of claim 13, wherein at least a part of the surface on a first layer side of the second layer is an oxide layer.

15. The reflective element of claim 14, wherein the reflective layer has a repeating structure of a Mo film and a Si film.

16. The reflective element of claim 14, wherein the first layer comprises ruthenium (Ru) or a ruthenium compound.

17. The reflective element of claim 14, wherein the second layer is made of a different material than the first layer.

18. The reflective element of claim 14, wherein the second layer has a thickness in a range of 0.3 to 3.0 nm.

19. The reflective element of claim 14, wherein the second layer has a thickness in a range of 0.3 to 0.6 nm.

20. The reflective element of claim 14, further comprising an absorber layer comprising tantalum (Ta), wherein the absorber layer is disposed on the protective layer.

21. The reflective element of claim 14, further comprising a low reflective layer comprising tantalum nitride (TaN), wherein the low reflective layer is disposed on the absorber layer.

* * * * *